(12) United States Patent
King et al.

(10) Patent No.: US 7,279,887 B1
(45) Date of Patent: Oct. 9, 2007

(54) IN-PROCESS SYSTEM LEVEL TEST BEFORE SURFACE MOUNT

(75) Inventors: Marc E. King, Los Gatos, CA (US); Kwok Leung Adam Chan, Tuen Mun (HK); Yufang Wang, Fremont, CA (US)

(73) Assignee: Nvidia Corporation, Santa Clara, CA (US)

( * ) Notice: Subject to any disclaimer, the term of this patent is extended or adjusted under 35 U.S.C. 154(b) by 16 days.

(21) Appl. No.: 10/912,910

(22) Filed: Aug. 6, 2004

(51) Int. Cl.
*G01R 31/02* (2006.01)
*G01R 31/28* (2006.01)

(52) U.S. Cl. .................................. 324/158.1; 324/765

(58) Field of Classification Search ............ None
See application file for complete search history.

(56) References Cited

U.S. PATENT DOCUMENTS

| | | | | |
|---|---|---|---|---|
| 2,795,755 A | * | 6/1957 | Anthes et al. | 324/407 |
| 5,247,689 A | * | 9/1993 | Ewert | 710/317 |
| 5,409,568 A | * | 4/1995 | Vasche | 216/17 |
| 5,499,248 A | * | 3/1996 | Behrens et al. | 714/724 |
| 5,635,718 A | * | 6/1997 | DePuydt et al. | 250/370.09 |
| 5,818,252 A | * | 10/1998 | Fullman et al. | 324/765 |
| 5,913,034 A | * | 6/1999 | Malcolm | 709/223 |
| 6,878,172 B2 | * | 4/2005 | Jensen | 29/25.01 |
| 6,914,424 B2 | * | 7/2005 | Chi et al. | 324/158.1 |

* cited by examiner

*Primary Examiner*—Ernest Karlsen

(57) ABSTRACT

Methods and systems for testing an integrated circuit during an assembly process are described. The integrated circuit is received from inventory. The integrated circuit is placed in a socket on a first circuit board for system-level testing. The system-level testing is performed prior to placement and permanent attachment of the integrated circuit onto a second circuit board. Provided the integrated circuit passes the system-level testing, the placement and permanent attachment of the integrated circuit to the second circuit board is the next step following the system-level testing in the assembly process.

7 Claims, 2 Drawing Sheets

IN-PROCESS SYSTEM LEVEL TEST BEFORE SURFACE MOUNT

FIELD OF THE INVENTION

Embodiments of the present invention generally relate to the testing of electronic components.

BACKGROUND ART

Conventionally, an electronic component such as an integrated circuit is tested at the component level and then at the system level before it is placed into inventory. The integrated circuit is later retrieved from inventory, and placed and permanently mounted (e.g., soldered) onto a printed circuit board. Diagnostic testing of the assembled circuit board is then performed to determine whether the assembled circuit board is functioning properly.

Prior art processes are problematic for a number of reasons. For example, the software used for system-level testing is frequently upgraded. Consequently, by the time the integrated circuit is retrieved from inventory and mounted onto a printed circuit board, a claim cannot be made that the integrated circuit has been system-level tested using the latest version of software.

In addition, the integrated circuit will typically experience a certain amount of handling between the time it is system-level tested and the time that it is mounted onto a circuit board. For instance, as mentioned above, the integrated circuit is moved into inventory after system-level testing and then out of inventory for assembly with the circuit board, adding steps and thus inefficiency to the assembly process. In addition, after system-level testing, the integrated circuit may be shipped to the manufacturer of circuit board assemblies. The shipping and handling of the integrated circuit can damage the integrated circuit (e.g., electrostatic discharge) and otherwise negatively affect its reliability.

However, if the integrated circuit is damaged in some manner during its time in inventory or by shipping and handling, any problems will not be detected until the integrated circuit is mounted onto the circuit board and the diagnostic testing is performed. At that point, if a defect is found, then the entire circuit board assembly, including other parts of the circuit board assembly in addition to the integrated circuit, will likely be discarded. Thus, the entire circuit board assembly, as well as the time spent assembling it, is essentially wasted, thereby increasing costs.

SUMMARY OF THE INVENTION

Accordingly, a testing system and/or method that can reduce waste and costs while still effectively testing electronic components such as integrated circuits would be advantageous. Embodiments in accordance with the present invention provide these and other advantages.

Methods and systems for testing an integrated circuit during an assembly process are described. In one embodiment, component-level testing of the integrated circuit is performed prior to placing the integrated circuit into inventory. The integrated circuit can then be retrieved from inventory and placed in a socket on a first circuit board for system-level testing. System-level testing is performed just prior to placement and permanent attachment of the integrated circuit onto a second circuit board. Provided the integrated circuit passes the system-level testing, the next step in the assembly process is the placement and permanent attachment of the integrated circuit to the second circuit board.

In one embodiment, after the system-level test and after building the assembled circuit board (e.g., the second circuit board, the integrated circuit and other board components such as memory), diagnostic testing is performed.

By performing the system-level testing after the integrated circuit is retrieved from inventory, if there are upgrades made to test software while the integrated circuit is in inventory, then the upgraded software can be used for the system-level testing. Thus, the system-level testing can be performed using the latest version of test software. Also, regardless of how long the integrated circuit is in inventory and how much handling it may have experienced after component-level testing, the integrated circuit is tested before final attachment onto the second circuit board.

Furthermore, according to one embodiment, after completing the system-level testing, the integrated circuit can be transferred directly from the first circuit board to the second circuit board, thereby reducing handling after the system-level testing.

Also, by performing the system-level testing just prior to mounting of the integrated circuit onto the second circuit board, the system-level testing can be designed so that it is more specific to the intended use of the integrated circuit. That is, the integrated circuit may be usable in a number of different products for a number of different types of applications. According to the embodiments of the present invention, the system-level tests can be designed so that they are more specific to a particular product and application.

If the integrated circuit fails the system-level testing, then it can be discarded before it is permanently attached to the second circuit board. Thus, only the integrated circuit is discarded, instead of the entire circuit board assembly, thereby reducing waste and costs.

The objects and advantages mentioned above, as well as other objects and advantages of the various embodiments of the present invention, will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention.

The drawings referred to in the description should not be understood as being drawn to scale except if specifically noted.

DETAILED DESCRIPTION OF THE INVENTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Figure 1:
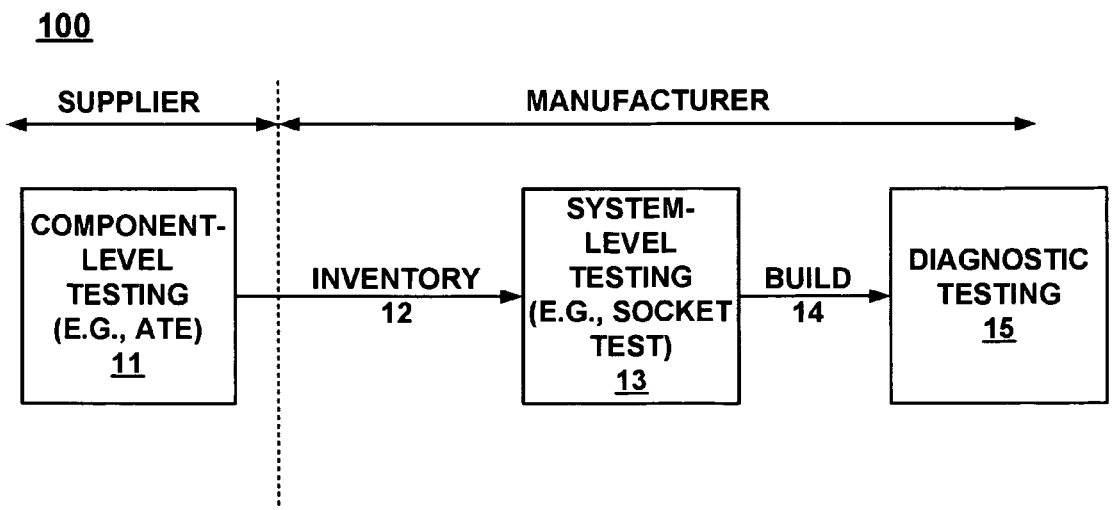
FIG. 1 is a block diagram showing stages of a test and assembly process according to one embodiment of the present invention.

FIG. 1 is a block diagram showing stages of a test and assembly process 100 according to one embodiment of the present invention. In the present embodiment, process 100 receives an electronic component for testing and assembly. In general, testing includes component-level testing 11, system-level testing 13 and perhaps diagnostic testing 15. In general, assembly (e.g., build 14) includes mounting of the component on a printed circuit board, typically with other components, such as memory elements, that may or may not already be in place on the printed circuit board.

In one embodiment, the electronic component is an integrated circuit. In one particular embodiment, the integrated circuit is a graphics processing unit (GPU) that is used for rendering three-dimensional graphical images for electronic games and other such applications. However, the present invention is not so limited, and may be applied to other types of electronic components and integrated circuits.

In the present embodiment, process 100 pertains primarily to the process of building a printed circuit board assembly (PCBA) that includes the integrated circuit (along with other components such as memory); however, in the present embodiment, process 100 does not pertain to the process of fabricating the integrated circuit. That is, process 100 picks up after the integrated circuit has been fabricated. That is not to say that elements of the chip fabrication process cannot be incorporated into process 100. In other words, process 100 is not limited to the stages shown in the example of FIG. 1; process 100 can include other processes and stages associated with the fabrication, testing and assembly of an integrated circuit or PCBA. Importantly, embodiments of the present invention can be implemented in conjunction with those other (perhaps conventional) processes and stages without significantly perturbing them. Generally speaking, embodiments in accordance with the present invention can be inserted into a conventional process, replacing certain stages of that process, without significantly affecting the other stages of that process.

Component-level testing 11, in general, consists of ATE (automated test equipment) testing to test the functionality of the integrated circuit itself. In component-level testing 11, the "world" (environment) external to the integrated circuit is simulated and the integrated circuit is tested to verify its performance relative to, for example, AC timing (e.g., signal propagation delays, skew, etc.) or DC parameters (e.g., output voltage/current, leakage current, etc.). Component-level testing of this type is known in the art.

In system-level testing 13, the integrated circuit is tested at the system level. The integrated circuit is coupled to a testing circuit board, usually using some type of mechanism such as a socket (e.g., a ball grid array) on the test board that allows the integrated circuit to be readily plugged into and unplugged from the test board. The testing circuit board includes other components such as memory elements and the like. Thus, the functionality of the integrated circuit is tested in convergence with real-world components (including not just hardware but also firmware and software) instead of a simulated world.

System-level testing is generally known in the art. However, what is significant is that, according to embodiments of the present invention, the system-level testing 13 of process 100 can be designed to be more specific to the intended final use of the integrated circuit; this is discussed further below. What is also of significance is the placement of system-level testing 13 in process 100. Instead of performing the component-level testing and the system-level testing on the integrated circuit, and then placing the integrated circuit into inventory, according to embodiments of the present invention the integrated circuit is component-level tested and then placed into inventory. Subsequently, according to embodiments of the present invention, the integrated circuit is retrieved from inventory and system-level tested.

Thus, according to embodiments of the present invention, the system-level testing 13 is performed after the integrated circuit is placed into (and retrieved from) inventory 12. Importantly, according to embodiments of the present invention, the system-level testing 13 is performed just prior to build 14. That is, the system-level testing 13 is performed in the stage of process 100 that immediately precedes the stage (build 14) in which the integrated circuit is permanently placed and attached to a circuit board.

Process 100 of the present invention offers a number of advantages. For one, the integrated circuit is system-level tested after it has spent time in inventory 12 and after any handling, including shipping of the integrated circuit from a supplier (e.g., the fabricator of the integrated circuit) to a manufacturer (e.g., the assembler of the PCBA that uses the integrated circuit). Any defects or other problems introduced while in inventory or during shipping and handling can thus be detected during system-level testing 13.

Also, should the integrated circuit fail the system-level testing 13, it can be discarded prior to final assembly onto the PCBA. Thus, if there is a problem with the integrated circuit, the entire PCBA does not have to be discarded, reducing waste and costs; instead, only the integrated circuit is discarded. The integrated circuit may also be reworked and retested instead of being discarded.

Furthermore, during the time in which the integrated circuit is in inventory 12, or during shipping and handling of the integrated circuit, there may be changes made to the software used for the system-level testing 13. By in essence delaying system-level testing 13 to the stage just prior to build 14, any software upgrades can be included in the testing. As such, the integrated circuit is system-level tested to the latest available version of software.

Moreover, system-level testing 13 can be designed so that it is more specific to the product, platform and/or application with which the integrated circuit will be used. That is, the integrated circuit may be designed so that it can be used in different types of products, on different types of platforms, or for different types of applications. The integrated circuit can then be supplied to various manufacturers, each of whom may produce different types of PCBAs. Instead of performing relatively generic system-level tests on a relatively generic testing circuit board, with the intention of encompassing the possible uses of the integrated circuit, system-level testing 13 can be designed by each manufacturer to be more specific to the manufacturer's intended final use of the integrated circuit. For example, the testing circuit board (e.g., first circuit board 23 of FIG. 2) used in system-level testing 13 can be configured more like the printed circuit board used in the final product, and the tests themselves can be designed so that they more closely represent the conditions that the integrated circuit is likely to experience in actual consumer applications.

Continuing with reference to FIG. 1, it is foreseeable that, by system-level testing the integrated circuit according to the present invention, component-level testing 11 and/or aspects of diagnostic testing 15 can perhaps be eliminated or performed less frequently. Under some conditions, the objectives of component-level testing 11 and system-level testing 13 may become redundant. Specifically, ATE can be eliminated because the integrated circuit is tested during the system-level test. Similarly, aspects of the diagnostic testing 15 that focus on the integrated circuit may become redundant to the system-level testing 13.

Thus, perhaps up to two of steps can be eliminated or reduced. For example, conventionally the following sequence of steps may be performed: fabrication and assembly of the integrated circuit; ATE; system-level testing; surface mounting; functional testing (FT); outgoing quality assurance (OQA); and then shipping of the PCBA. FT is in general a comprehensive diagnostic test of the PCBA (primarily, the integrated circuit and its memory interface). OQA includes a relatively brief diagnostic test typically run during or after the PCBA is packed, usually done on a sample basis to make sure that the outgoing shipment has no "last minute" problems.

However, according to embodiments of the present invention, the following sequence of steps may be performed: fabrication and assembly of the integrated circuit; system-level testing as described by process 100 of FIG. 1; surface mounting; OQA; and shipping of the PCBA. Thus, ATE and functional testing, and perhaps even the diagnostic portion of OQA, can be eliminated or at least reduced.

Another advantage provided by process 100 is that the integrated circuit can be transferred directly from the testing circuit board to the printed circuit board on which it will be permanently mounted. This is discussed further in conjunction with FIG. 2.

Figure 2:
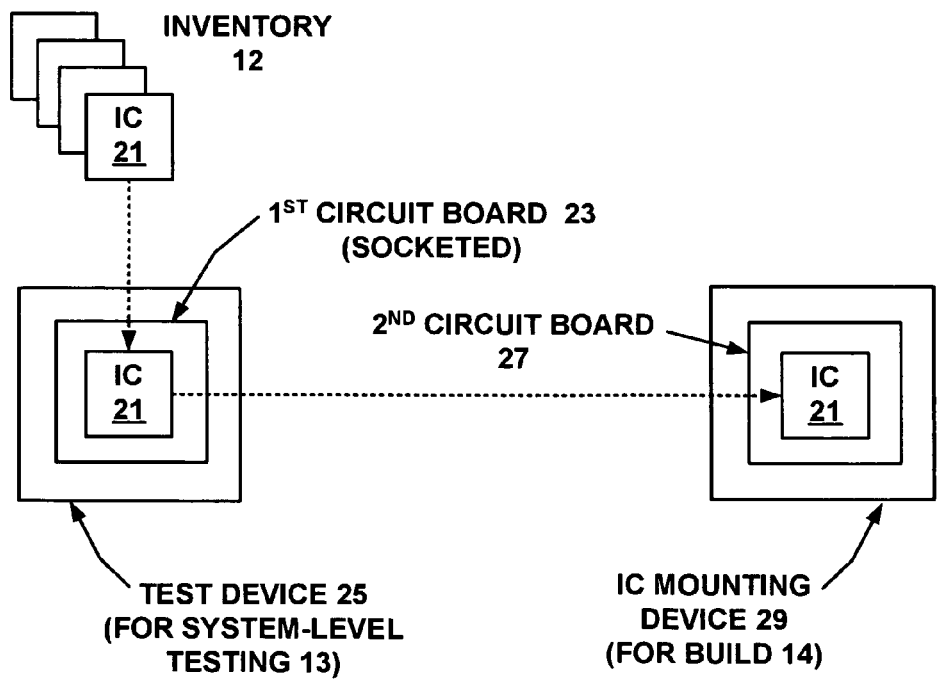
FIG. 2 is a block diagram showing an integrated circuit passing through various stages of a test and assembly system according to one embodiment of the present invention.

FIG. 2 is a block diagram showing an integrated circuit passing through various stages of a test and assembly system 200 according to one embodiment of the present invention. According to the example of FIG. 2, an integrated circuit (IC) 21 is retrieved from inventory and placed into a first circuit board 23 for the system-level testing 13 of FIG. 1. The integrated circuit 21 is not permanently attached to the first circuit board 23; as mentioned above, it is coupled to the first circuit board 23 in some manner (e.g., using a socket) that allows it to be readily removed from the first circuit board 23 after testing. The system-level testing 13 of the integrated circuit 21 is performed by test device 25. Also, although described for a single integrated circuit, first circuit board 23 can be configured with multiple sockets so that multiple integrated circuits can be system-level tested at the same time.

Upon completion of the system-level testing 13, and presuming that the integrated circuit 21 passes, then the integrated circuit 21 can be transferred directly to the integrated circuit mounting device 29, which places and permanently attaches (e.g., solders) the integrated circuit 21 to a second circuit board 27 using surface mounting technology (SMT). That is, in the present embodiment, test device 25 and integrated circuit mounting device 29 are located in proximity to one another so that, for example, an automated (e.g., robotic) handling mechanism can pick up integrated circuit 21 from first circuit board 23 and place it onto second circuit board 27, to which the integrated circuit 21 is then permanently attached. Diagnostic testing 15 (FIG. 1) of the printed circuit board assembly that includes second circuit board 27 and integrated circuit 21 can then be performed.

Thus, by performing system-level testing 13 in the stage just prior to build 14, and by locating test device 25 and integrated circuit mounting device 29 sufficiently close to one another so that they can be serviced by the same handling mechanism, the amount of handling of the integrated circuit can be reduced, making the overall process more efficient and also reducing the possibility of a defect being introduced by the handling. In addition, real-time yield monitoring and data collection are facilitated, providing prompt feedback for quality control purposes.

Figure 3:
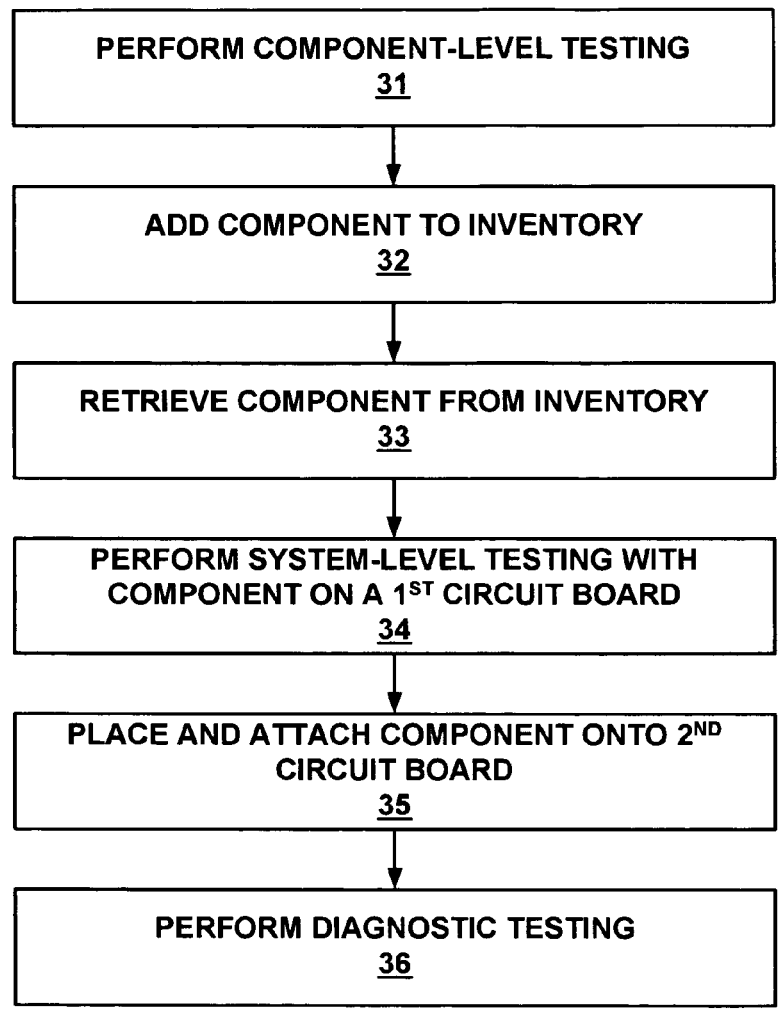
FIG. 3 is a flowchart of a method for testing an integrated circuit during an assembly process according to one embodiment of the present invention.

FIG. 3 is a flowchart 300 of a method for testing an integrated circuit during an assembly process according to one embodiment of the present invention. Although specific steps are disclosed in flowchart 300, such steps are exemplary. That is, the present invention is well suited to performing various other steps or variations of the steps recited in flowchart 300. It is appreciated that the steps in flowchart 300 may be performed in an order different than presented and that the steps in flowchart 300 are not necessarily performed in the sequence illustrated.

In step 31 of FIG. 3 and referring also to FIG. 1, in one embodiment, component-level testing 11 of integrated circuits is performed. The component-level testing 11 may be performed by a supplier at a physical location different from the location of the manufacturer. The integrated circuits can then be shipped to the manufacturer.

In step 32 of FIG. 3 and referring also to FIG. 1, the integrated circuits are placed in inventory 12. The integrated circuits may be in inventory 12 for any period of time, and while in inventory 12 they may be handled frequently or not at all.

In step 33 of FIG. 3 and referring also to FIGS. 1 and 2, an integrated circuit is removed from inventory 12 and coupled to a first circuit board 23 for system-level testing 13.

In step 34 of FIG. 3 and referring also to FIG. 1, the system-level testing 13 of the integrated circuit, mounted on the first circuit board 23, is performed. Note that if the software used in testing is changed while the integrated circuit is in inventory 12, then the upgraded software can be used in the system-level testing 13. Also, the system-level testing 13 can be designed so that it is specific, or relatively specific, to the intended use of the integrated circuit.

In step 35 of FIG. 3 and referring also to FIGS. 1 and 2, if the integrated circuit passes the system-level testing 13, then it is removed from the first circuit board 23 and placed and permanently attached (e.g., soldered) to the second circuit board 27. The placement and attachment of the integrated circuit is the next step following the system-level testing 13. The integrated circuit can be transferred directly from the test device 25 (for system-level testing 13) to the integrated circuit mounting device 29 (for placement and attachment onto the second circuit board 27). If the integrated circuit does not pass the system-level testing 13, it can be reworked or discarded.

In step 36 of FIG. 3 and referring also to FIGS. 1 and 2, in one embodiment, diagnostic testing 15 is performed on the PCBA (e.g., second circuit board 27 and IC 21).

In summary, embodiments of the present invention provide methods and systems for testing integrated circuits during assembly onto a printed circuit board. In essence, the present invention "tests for build" instead of "builds for test." Just before surface mounting of an integrated circuit onto a printed circuit board, system-level testing of the integrated circuit is performed using a socketed testing board. Accordingly, regardless of how long the integrated circuit was in inventory or how much the integrated circuit was handled, the integrated circuit is demonstrated to be good before it is mounted onto a circuit board. In addition, waste, costs, handling and reworking are reduced, and data collection is improved. Also, system-level testing is performed closer in time and physical location to the point of assembly and use.

Embodiments of the present invention, in-process system level test before surface mount, are thus described. While the present invention has been described in particular embodiments, it should be appreciated that the present invention should not be construed as limited by such embodiments, but rather construed according to the below claims.

What is claimed is:

1. A method of testing integrated circuits during an assembly process, said method comprising:
    accessing a first integrated circuit from inventory;
    accessing a second integrated circuit from inventory;
    coupling said first integrated circuit to a socket on a first circuit board for first system-level testing, wherein said first circuit board is selected according to a first type of product and application;
    coupling said second integrated circuit to a socket on a second circuit board for second system-level testing, wherein said second circuit board is selected according to a second type of product and application that is different from said first type;
    performing said first system-level testing of said first integrated circuit coupled to said first circuit board prior to placement and permanent attachment of said first integrated circuit onto a third circuit board that is configured according to said first type of product and application, wherein said first system-level testing is specific to said first type of product and application; and
    performing said second system-level testing of said second integrated circuit coupled to said second circuit board prior to placement and permanent attachment of said second integrated circuit onto a fourth circuit board that is configured according to said second type of product and application, wherein said second system-level testing is specific to said second type of product and application.

2. The method of claim 1 further comprising:
performing component-level testing of said first and second integrated circuits prior to placing said first and second integrated circuits in said inventory.

3. The method of claim 2 further comprising:
placing said first and second integrated circuits in said inventory prior to said first and second system-level testing and subsequent to said component-level testing; and
upgrading software used for said first and second system-level testing subsequent to placing said first and second integrated circuits in inventory, wherein the upgraded software is used for said first and second system-level testing.

4. The method of claim 1 further comprising:
performing diagnostic testing of said third circuit board including said first integrated circuit subsequent to said placement and permanent attachment.

5. The method of claim 1 further comprising:
removing said first and second integrated circuits from said first and second circuit boards, wherein said first and second integrated circuits are transferred directly from said first circuit board to said third circuit board and from said second circuit board to said fourth circuit board, respectively.

6. The method of claim 1 further comprising:
discarding said first integrated circuit prior to said placement and permanent attachment if said system-level testing is failed.

7. The method of claim 1 wherein said placement and permanent attachment to said third circuit board is the next step following said first system-level testing in said assembly process provided said first integrated circuit passes said system-level testing.

* * * * *